US005093600A

United States Patent [19]

Kohl

[11] Patent Number: 5,093,600

[45] Date of Patent: Mar. 3, 1992

[54] PIEZO-ELECTRIC RELAY

[75] Inventor: James E. Kohl, Schenectady, N.Y.

[73] Assignee: Pacific Bell, San Francisco, Calif.

[21] Appl. No.: 98,535

[22] Filed: Sep. 18, 1987

[51] Int. Cl.[5] .......... H01L 41/08

[52] U.S. Cl. .......... 310/332; 310/317; 310/330

[58] Field of Search .......... 310/330-332, 310/317; 200/181

[56] References Cited

U.S. PATENT DOCUMENTS

| | | | |
|---|---|---|---|
| 3,507,054 | 4/1970 | Janke | 200/181 |
| 4,395,651 | 7/1983 | Yamamoto | 310/330 X |
| 4,403,166 | 9/1983 | Tanaka et al. | 310/332 |
| 4,595,855 | 6/1986 | Farrall | 310/332 |
| 4,620,123 | 10/1986 | Farrall et al. | 310/332 X |
| 4,620,124 | 10/1986 | Farrall et al. | 310/332 |

FOREIGN PATENT DOCUMENTS

| | | | |
|---|---|---|---|
| 273157 | 7/1964 | Australia | 310/331 |

*Primary Examiner*—Mark O. Budd
*Attorney, Agent, or Firm*—McCubbrey, Bartels, Meyer & Ward

[57] ABSTRACT

A piezoelectric relay requiring less piezoelectric material than conventional piezoelectric relays is disclosed. The relay differs from conventional relays in that the contacts are touching with essentially no force applied between the contacts when no power is applied to the relay.

3 Claims, 3 Drawing Sheets

PIEZO-ELECTRIC RELAY

The present invention relates to piezoelectric activated relays and more particularly to relays in which the contacts are actuated by the motion of a bimorph constructed from piezoelectric materials.

Piezoelectric relays having a movable contact on the end of a bimorph structure are well known to the prior art. The bimorph structure typically consists of two elongated strips of piezoelectric material such as lead zirconate titanate bonded to a center conducting strip. The outer surfaces of the two elongated strips which are not bonded to the center conductor are covered with a conducting material to form outer electrodes. Each of the elongated strips is polarized such that the application of an electric field across the narrow dimension of the strip results in a change in the length of the strip. In prior art relays which employ this type of actuator, the electric field is typically applied to the two strips in the bimorph such that one of the two strips is shortened while the other of the two strips is lengthened. This results in a deflection of the bimorph in a direction perpendicular to the axis of the elongated strips. This deflection is typically used to make or break an electrical circuit by causing a contact mounted on the bimorph to touch another contact or to move away from the contact in question, respectively.

The prior art relays are constructed such that the bimorph closes the contacts when it is deflected to one side of a neutral resting position. The force with which the contacts are closed decreases with the displacement of the bimorph from the neutral position. Since this force determines the load rating of the relay, it is desirable to make the distance as small as possible. However, the displacement distance between the resting position and the point at which the contacts close can not be made arbitrarily small in practice with this design, since a gap must exist to prevent arcing in the circuit when the contacts are in their neutral position. In addition, a further gap must be included to compensate for manufacturing tolerances. Hence, the contacts must be deflected through a substantial distance before the contacts are closed when the relay is activated. As a result, the force applied by the bimorph to the contacts is substantially less than the maximum force which the bimorph is capable of producing. To compensate for this decrease in contact force, larger bimorphs must be used which increases the cost of the relay.

Generally, it is an object of the present invention to provide an improved piezoelectric relay.

It is another object of the present invention to provide a piezoelectric relay in which the maximum contact force which the bimorph is capable of generating at a given driving voltage is applied to the contacts when said contacts are closed while still providing a sufficient gap between the contacts when the contacts are open.

It is yet another object of the present invention to provide a piezoelectric relay which requires less piezoelectric material to construct than prior art piezoelectric relays having the same load rating.

These and other objects of the present invention will become apparent to those skilled in the art from the following detailed description of the invention and the accompanying drawings.

SUMMARY OF THE INVENTION

Figure 1:
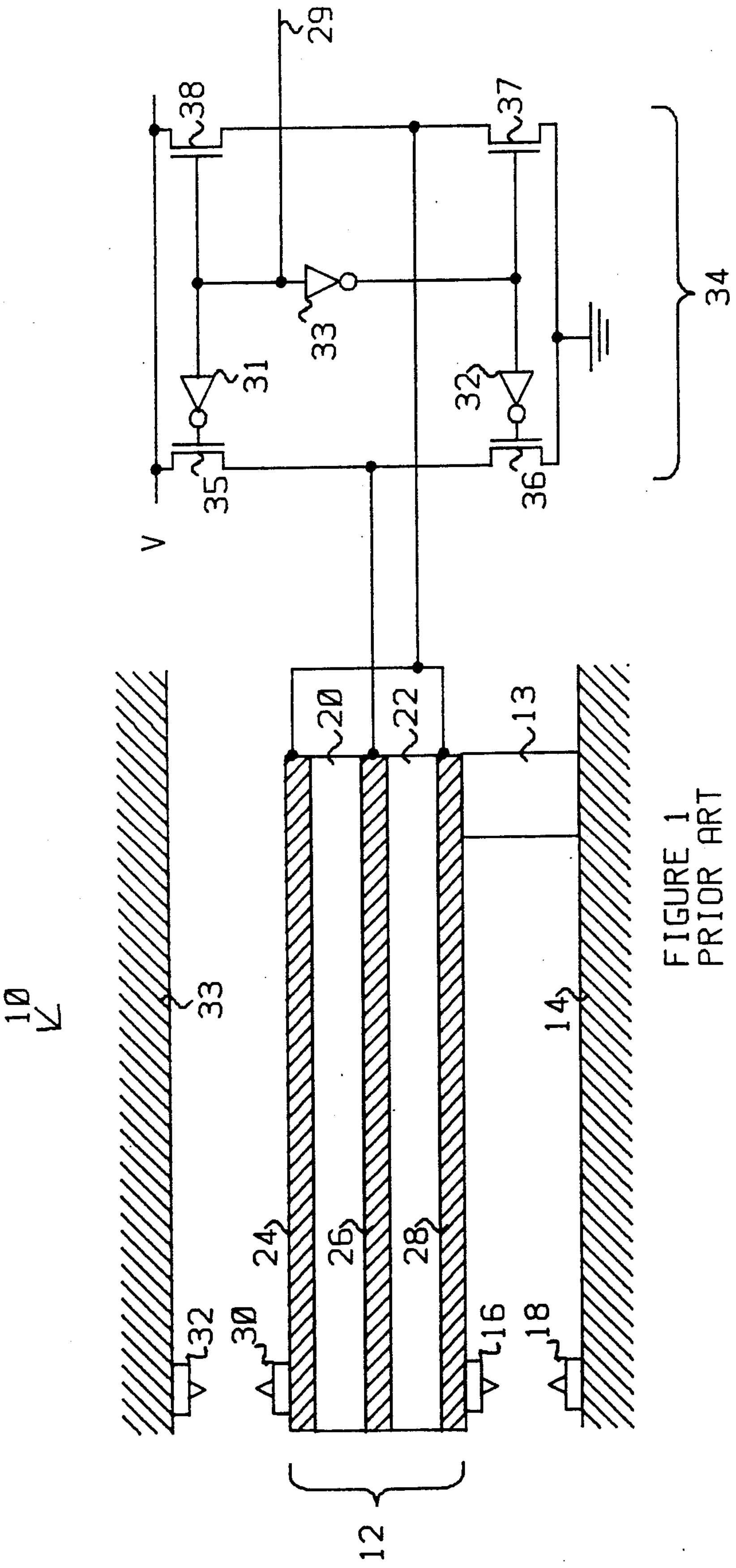
FIGURE 1 PRIOR ART
FIG. 1 is a cross-sectional view of a prior art piezoelectric relay.

The present invention comprises a piezoelectric relay which includes a mounting surface preferably having a raised portion thereon and a bimorph member. The bimorph member has one end cantilever mounted to the raised portion, the opposite end being free to move in response to electrical potentials applied to the bimorph member. The bimorph member comprises first and second substantially planar strips of piezoelectric material, the planar strips being bonded to three planar electrodes having a substantially parallel relationship to one another. The first electrode is located on the outer surface of the first planar strip. The second planar electrode is sandwiched between the first and second planar strips. And the third planar electrode is located on the outer surface of the second planar strip so as to substantially overlie the first planar electrode. The relay is adapted for connection to circuitry for applying an electrical potential between said first and second electrodes and between said second and third electrodes. A first contact is coupled to the free end of the bimorph member. A second contact is mounted on the mounting surface such that the first contact is caused to move toward the second contact by the application of the electrical potential between the second and third planar electrodes. The first contact is caused to move in a direction separating the first and second contact means by the application of an electrical potential between said first and second planar electrodes. The first and second contacts are positioned such that said contacts are substantially touching when no electric potential is applied to said electrodes.

DETAILED DESCRIPTION OF THE INVENTION

The advantages of the present invention can best be illustrated with reference to a typical prior art piezoelectric relay which is shown at 10 in FIG. 1. The relay comprises a piezoelectric bimorph 12 which is mounted in a cantilever manner over a surface 14 by attaching the one end to a raised portion 13 on mounting surface 14. The free end of the bimorph 12 includes a first electrical contact 16 which is electrically isolated from bimorph 12. Contact 16 is brought into physical contact with a second electrical contact 18 when the free bimorph end on which said first electrical contact 16 is mounted moves toward surface 14.

The bimorph 12 typically consists of two planar strips of piezoelectric material 20 and 22 which are bonded to three planar electrodes 24, 26, and 28. Electrodes 24 and 28 are typically constructed by plating a conducting material such as nickel on the corresponding piezoelectric strips. Electrode 26 may be a brass shim in electrical contact with the inner surfaces of strips 20 and 22. Each of the strips of piezoelectric material 20 and 22 is polarized such that the application of an electrical field across the strip will result in a change in the length of the strip. This polarization is typically accomplished by applying voltages between the two electrodes on each side of the piezoelectric sheet while cooling the piezoelectric sheet in question from a temperature above the Curie point of the piezoelectric material to a temperature below said Curie point. Alternatively, the polarization may be carried out at room temperature if larger potentials are applied across the piezoelectric sheet. After polarization, the direction of the applied electrical field relative to the direction of polarization determines whether the length of the strip will increase or decrease. If the electric field produced by the potentials on the electrodes is in the same direction as the electric field used to polarize the piezoelectric strip, the piezoelectric strip will decrease in length. In relay 10, the polarization of strip 20 is in the same direction as that of strip 22.

The electric fields used to actuate the relay are typically generated by the application of an electrical potential between electrodes 24 and 26 simultaneously with the application of the opposite potential between electrodes 26 and 28. This potential pattern produces electric fields which cause one of the strips to shorten and the other to elongate. As a result, the bimorph will either bend toward surface 14 or away from said surface depending on the direction the electrical fields generated. One direction being used to close the relay contacts, the other being used to move the contacts away from each other. In principle, this second motion can be used to cause a second set of contacts 30 and 32 to close thus implementing a relay.

The electric fields in question are typically generated by a driving circuit such as that shown at 34. Circuit 34 has two states which are specified by a signal on a control line 29. Driving circuit 34 includes four transistors, 35, 36, 37, and 38, which are preferably FETs and three inverters, 31, 32, and 33. It is assumed that all of the transistors have the same threshold voltage. When a potential which is above the threshold voltage of the FETs is applied on control line, the potentials on the gates of transistors 36 and 38 will be above the threshold voltage. And, the potentials on the gates of transistors 35 and 37 will be below the threshold voltage. In this case, electrode 26 will be coupled to the power rail labeled with the ground symbol, and electrodes 24 and 28 will be coupled to the power rail labeled V.

Similarly, when a potential which is below the threshold voltage of the FETs is applied on control line, the potentials on the gates of transistors 35 and 37 will be above the threshold. And, the potentials on the gates of transistors 36 and 38 will below the threshold voltage. In this case, electrode 26 will be coupled to the V power rail, and electrodes 24 and 28 will be coupled to the ground power rail. Such circuitry is conventional in the electronic arts.

The cost of fabricating the relay shown in FIG. 1 is directly related to the amount of piezoelectric material needed to fabricate bimorph 12. The size of the bimorph 12 is determined by the load rating of the relay, minimum separation of the contacts in the open position needed to prevent arcing, and the assembly tolerances with which the bimorph can be positioned relative to the surfaces 14 and 33. In relays in which only low voltages are applied to the contacts, the contacts must be separated by typically 4 to 10 mils in the neutral position.

To prevent welding of the contacts 16 and 18, the contacts must be pressed together with a force greater than some predetermined force which depends on the desired load rating of the relay when the contacts are in the closed position. This force is typically 5 to 10 grams in low current relays. For a given driving voltage, the force applied by the end of the bimorph depends on the displacement of the bimorph from its neutral resting position, the length of the bimorph, and the width of the bimorph.

Figure 2:
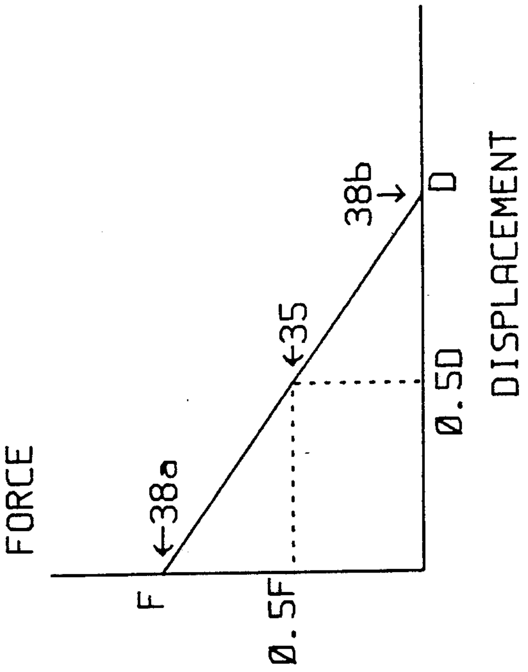
FIG. 2 illustrates the relationship between the force applied by the bimorph shown in FIG. 1 against an object limiting the displacement of the free end of the bimorph from its neutral position and the displacement of the free end of the bimorph from its neutral position.

The relationship between the displacement of the bimorph from its resting position, i.e., the position in which no potential is applied to the electrodes 24, 26, and 28, and the force applied to the contacts by the end of the bimorph is shown in FIG. 2. For any given applied voltage between the center electrode 26 and the outer electrodes 24 and 28, there is a maximum force, F, which may be obtained from the bimorph and a maximum displacement, D. The maximum force is applied when the bimorph is held at the position closest to its resting position, i.e., when the displacement of the bimorph from its resting position is 0. Hence, to obtain the maximum force, one wishes to have contacts 16 and 18 as close as possible together. However, these contacts must be separated by a minimum distance which is equal to the sum of the minimum separation needed to prevent arcing when the contacts are open and the maximum acceptable fabrication error in assembling the bimorph with respect to surfaces 14 and 33.

Prior art relays typically operate such that the gap between contacts 16 and 18 shown in FIG. 1 is 0.5D when no potential is applied to the bimorph. The maximum force obtainable in these relays is hence 0.5F as shown at 35 in FIG. 2. This configuration represents a compromise which provides both sufficient force to close the contacts and sufficient displacement when the contacts are open to prevent arcing. The main advantage of this configuration is that a double-pole relay of the type illustrated in FIG. 1 is, in principle, possible.

For a bimorph having a length, l, and a width, w, it may be shown that the maximum displacement, D, is approximately proportional to $l^2$ and that the maximum force, F, which the bimorph can provide is approximately proportional to w/l. That is, $$D = kl^2, \text{ and} \quad (1)$$

$$F = k'w/l, \quad (2)$$

where k and k' are constants which depend on the applied voltage, the piezoelectric materials used to construct the bimorph, and the thicknesses of the bimorph and center electrode.

The cost of the relay illustrated in FIG. 1 is determined to a large extent by the volume of piezoelectric material needed to construct the bimorphs. The volume of material is, in turn, determined by the area of the piezoelectric sheet. That is, the cost of the bimorph is proportional to l times w. As noted above, the distance between the contacts when no power is applied to the relay must be greater than or equal to the sum of two distances, the contact separation needed to provide electrical isolation, $d_i$, and the maximum error in contact separation resulting from fabrication errors, $d_e$. For a double-throw relay of the type illustrated in FIG. 1, this error is essentially twice the error encountered in positioning one set of contacts relative to each other, since the error in positioning the upper contacts 30 and 32 with respect to each other may be as large as the error in positioning the lower contacts 16 and 18 plus the error in positioning the upper contacts relative to the lower contacts. Each of these errors is typically equal to $d_e$. It may be shown by substituting these distance values into Equations (1) and (2) that $$wl=(4f/kk')(d_i+2d_e), \quad (3)$$

where f is the desired contact force which is equal to 0.5 F for the relay shown in FIG. 1.

Figure 3:
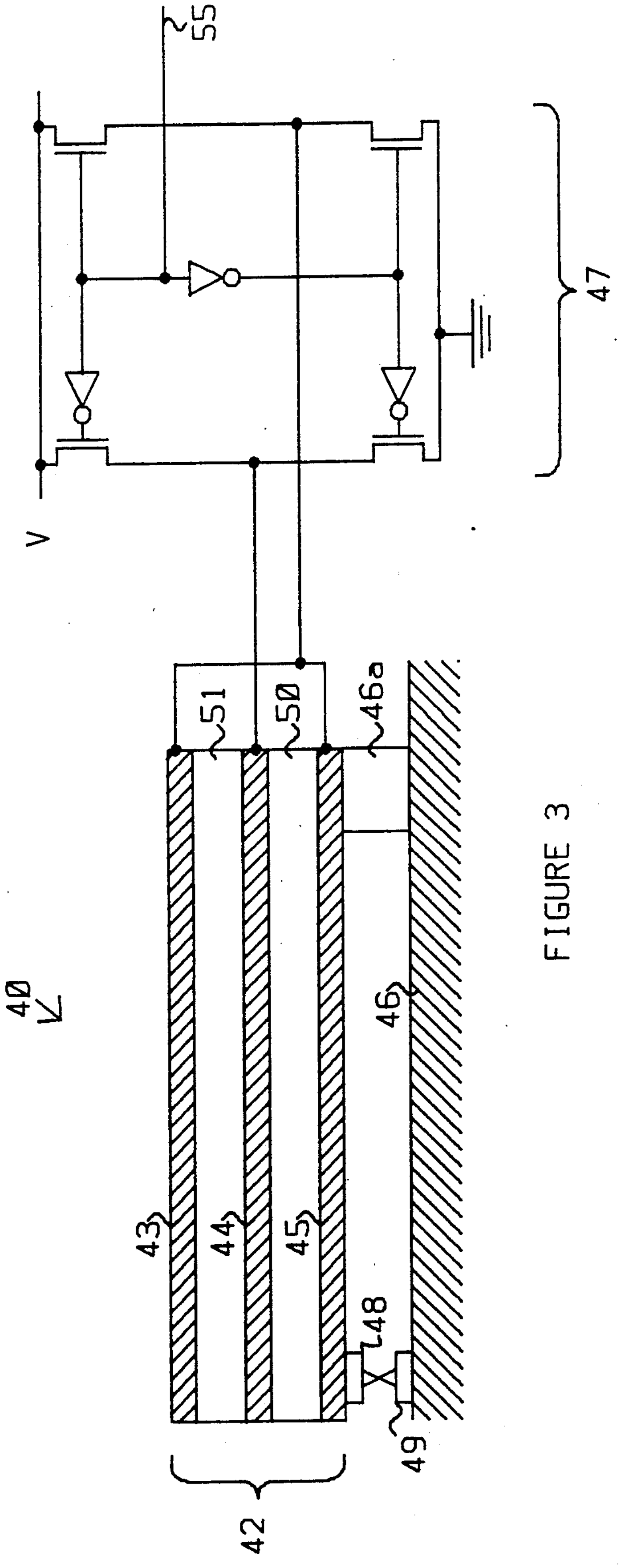
FIG. 3 is a cross-sectional view of a piezoelectric relay according to the present invention.

Referring now to FIG. 3, which illustrates a relay 40 according to the present invention, it will be shown that the material needed to construct a relay according to the present invention is substantially less than that given in Eq. (3). A relay according to the present invention differs from prior art piezoelectric relays in that the contacts are substantially touching in the neutral position. Relay 40 is similar to prior art relays in that it consists of a piezoelectric bimorph 42 which is mounted in a cantilever manner over a surface 46 by attaching one end of bimorph 42 to a raised portion 46*a* on surface 46. The free end of the bimorph 42 includes a first electrical contact 48 which is moved with respect to a second electrical contact 49 when the free bimorph end on which said first electrical contact 48 is mounted moves in response to the application of electrical potentials to planar electrodes 43, 44, and 45 using the driving circuit 47 in response to a signal on line 55.

Bimorph 42 is constructed in a manner analogous to bimorph 12 shown in FIG. 1. Bimorph 42 comprises two planar strips of piezoelectric material, preferably lead zirconate titanate, shown at 50 and 51 which are bonded to three planar electrodes 43, 44, and 45. These electrodes serve the analogous functions to electrodes 24, 26, and 28 shown in FIG. 1. A driving circuit 47 which is analogous to driving circuit 34 shown in FIG. 1 may be used to apply potentials to electrodes 43, 44, and 45 to cause the bimorph to move toward surface 46 or away from surface 46 depending on the potentials applied to the electrodes in question.

Relay 40 differs in two key features from the prior art relay 10 shown in FIG. 1. First, relay 40 is a single-pole relay. To construct a double-pole relay according to the present invention, two relays of the type shown in FIG. 3 must be combined.

Second, contacts 48 and 49 are positioned such that they are substantially touching in the neutral position. That is, when no electrical potential is applied, the separation of the contacts 48 and 49 in the neutral position is much smaller than the maximum displacement, D, described above. The contacts are preferably positioned such that they are within one tenth of D in the neutral position. In the "closed" position, contacts 48 and 49 are forced together by applying an appropriate electrical potential to planar electrodes 43, 44, and 45. Since the displacement from the neutral position is essentially zero, the maximum available force, F, is applied to the contacts. This operating point is shown in FIG. 2 at 38*a*.

When the relay is in the "open" position, the contacts 48 and 49 are forced apart by applying the reverse electrical potentials to said planar electrodes. This operating point is shown at 38*b* in FIG. 2. Since bimorph 42 is not required to apply force between the contacts in the open position, the full displacement, D, is available to separate the contacts.

The relay configuration of the present invention results in a substantial reduction in the amount of piezoelectric material needed to construct a relay according to the present invention, even when two relays are used to replace the single relay shown in FIG. 1.

The amount of material needed to produce two relays 40 may be calculated from Equations (1) and (2). For the purposes of this discussion, it will be assumed that the planar electrodes 43, 44, and 45 are driven with the same potentials as the planar electrodes 24, 26, and 28 shown in FIG. 1, and that the thickness of sheets 50 and 51 is the same as that of sheets 20 and 22. When the potentials are applied to close the relay, the force applied to the contacts, f, is equal to F, not to 0.5F as was the case with the prior art relay. This increased force results from the fact that the bimorph applies the force to the contacts at the point of zero displacement, since the contacts were aligned to be substantially touching when no potential was applied to the electrodes. When the reverse potentials are applied to separate contacts 48 and 49, the resultant displacement is D, not 0.5D as was the case with relay 10. Hence, the amount of material needed to construct a single-throw relay 40 is given by $$wl=(f/kk')(d_i+d_e) \quad (4)$$

Here, it has been assumed that the same alignment tolerances and electrical isolation distances apply to both relays. A double pole relay according to the present invention requires twice this amount of material. However, this is still less than half the material needed to construct a double-pole relay according to the prior art. This difference is even greater in low voltage relays in which the contact separation needed to prevent arcing, $d_i$, is small compared to the fabrication error distance, $d_e$. In this case, less than one quarter the material is required.

There has been described herein a novel piezoelectric relay. Various modifications to the present invention will become apparent to those skilled in the art from the foregoing description and accompanying drawings. For example, although the present invention has been described with reference to specific bimorph structures and driving circuitry, it will be apparent to those skilled in the art that the present invention may be practiced with other bimorph structures and driving circuitry. For example, a bimorph may be constructed by co-firing a metal layer between two green piezoceramic plates. The present invention is equally applicable to relays employing such bimorphs as actuators.

Similarly, the present invention may be practiced with relays in which the bimorph actuator is caused to move by applying an electric field to only one of the piezoelectric strips comprising the bimorph. In such relays, an electric field is applied to one of the piezoelectric strips in a direction which causes the piezoelectric strip to contract and no electric field is applied to the other piezoelectric strip. This results in the free end of the bimorph moving toward the piezoelectric strip to which the electric field was applied. The present invention is equally applicable to such relays. Accordingly, the present invention is to be limited solely by the scope of the following claims.

What is claimed is:

1. A piezoelectric relay for operation between an electrically closed state and an electrically open state, comprising:

a piezoelectric bimorph member;

means for supporting said bimorph member in a cantilevered neutral position such that one end of said bimorph member is secured and the opposite end of said bimorph member is free, said bimorph member being responsive to the application of a first electric field to move said free end of said bimorph member in a first direction with respect to said neutral position and being responsible to the application of a second electric field to move said free end of said bimorph member in a second direction substantially opposite to said first direction;

electrical contact means having a first portion secured to said bimorph member adjacent to said free end and having a second portion spaced from said free end of said bimorph member, said second portion of said contact means being positioned to electrically engage said first portion of said contact means upon application of said first electric field to cause said relay to enter said electrically closed state and to electrically disengage said first portion of said contact means upon application of said second electric field thereby causing said relay to enter said electrically open state, wherein said supporting means supports said bimorph member such that in said neutral position of said bimorph member, said first and second portions of said contact means are separated by a distance which is less than one tenth of the separation of said first and said second portions in said electrically open state, and wherein the force exerted between said first and second portions in said neutral position is Substantially zero;

first connecting means for connecting said bimorph member to an electric circuit for applying said first electric field to said bimorph member to operate said relay to the electrically closed state; and second connecting means for connecting said bimorph member to an electric circuit for applying said second electric field to said bimorph member to operate said relay to the electrically open state.

2. The piezoelectric relay of claim 1 wherein said bimorph member comprises first and second substantially planar strips of piezoelectric material, said planar strips being bonded to three planar electrodes having a substantially parallel relationship to one another, the first said electrode being located on the outer surface of said first planar strip, said second planar electrode being sandwiched between said first and second planar strips, and said third planar electrode being located on the outer surface of said second planar strip so as to substantially overlie said first planar electrode.

3. The piezoelectric relay of claim 2 wherein said first connecting means comprises means for connecting said second and third planar electrodes to an electric circuit for providing a potential difference between said second and third planar electrodes, and wherein said second connecting means comprises means for connecting said first and second planar electrodes to an electric circuit for providing a potential deference between said first and second planar electrodes.

* * * * *

UNITED STATES PATENT AND TRADEMARK OFFICE

CERTIFICATE OF CORRECTION

PATENT NO. : 5,093,600

DATED : March 3, 1992

INVENTOR(S) : Kohl

It is certified that error appears in the above-identified patent and that said Letters Patent is hereby corrected as shown below:

Column 3, line 31, after "a" insert --double-pole double-throw--.

Column 1, line 38, delete "can not" and insert therefor --cannot--.

Column 3, line 51, after "will" insert --be--.

Column 8, line 27, delete "deference" and insert therefor --difference--.

Signed and Sealed this

Twenty-fifth Day of May, 1993

*Attest:*

Michael K. Kirk

MICHAEL K. KIRK

*Attesting Officer*

*Acting Commissioner of Patents and Trademarks*